United States Patent [19]

Kloucek

[11] Patent Number: 5,027,192
[45] Date of Patent: Jun. 25, 1991

[54] FAST POWER SEMICONDUCTOR CIRCUIT

[75] Inventor: Franz Kloucek, Wettingen, Switzerland

[73] Assignee: Asea Brown Boveri Ltd., Baden, Switzerland

[21] Appl. No.: 463,354

[22] Filed: Jan. 11, 1990

[30] Foreign Application Priority Data

Feb. 7, 1989 [CH] Switzerland .................... 408/89

[51] Int. Cl.⁵ .................... H01L 27/02; H01L 23/14
[52] U.S. Cl. ........................................ 357/75; 357/38
[58] Field of Search .................. 357/75, 79, 76, 77, 357/38; 333/238, 246, 247

[56] References Cited

U.S. PATENT DOCUMENTS 3,358,196  12/1967  Steinmetz et al. ............ 357/79
3,519,895   7/1970  Marino et al. ................ 357/80
4,259,684   3/1981  Dean et al. ................... 333/247
4,476,446  10/1984  Blight .......................... 333/247
4,574,299   3/1986  Glascock, II et al. ......... 357/75
4,768,075   8/1988  Broich et al. ................. 357/75
4,920,406   4/1990  Watanabe et al. ............ 357/75

FOREIGN PATENT DOCUMENTS 0178387  4/1986  European Pat. Off. .
0228226  7/1987  European Pat. Off. .
0268260  5/1988  European Pat. Off. .

Primary Examiner—Rolf Hille
Assistant Examiner—S. V. Clark
Attorney, Agent, or Firm—Oblon, Spivak, McClelland, Maier & Neustadt

[57] ABSTRACT

In a fast power semiconductor circuit with a gate turn-off component in the form of a large-area semiconductor substrate (9) and a drive circuit, which is connected to gate and cathode of the component and generates a current pulse suitable for turning off the component, a low-inductive connection is realized between component and drive circuit by a stripline (28) in the form of a metal-laminated plastic film.

The upper metallization (1) of the stripline (28) serves in this case essentially as feed to the cathode of the component, the lower metallization (3) serves essentially as feed to the gate.

10 Claims, 3 Drawing Sheets

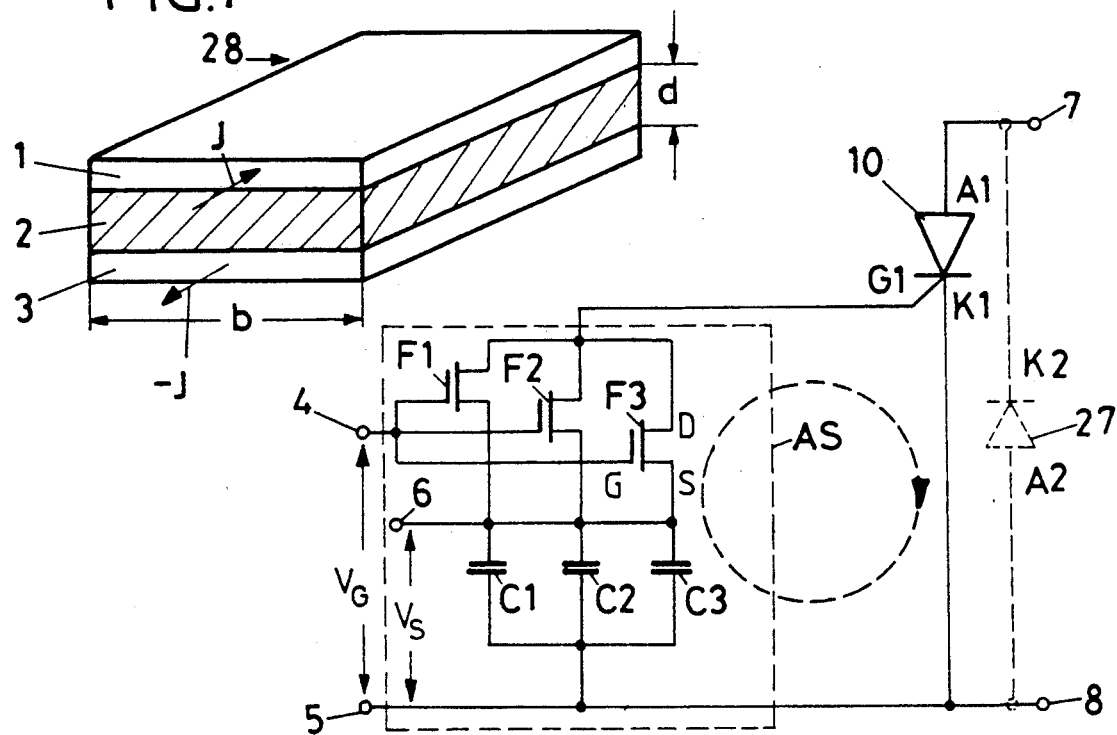
FIG.1
FIG.2
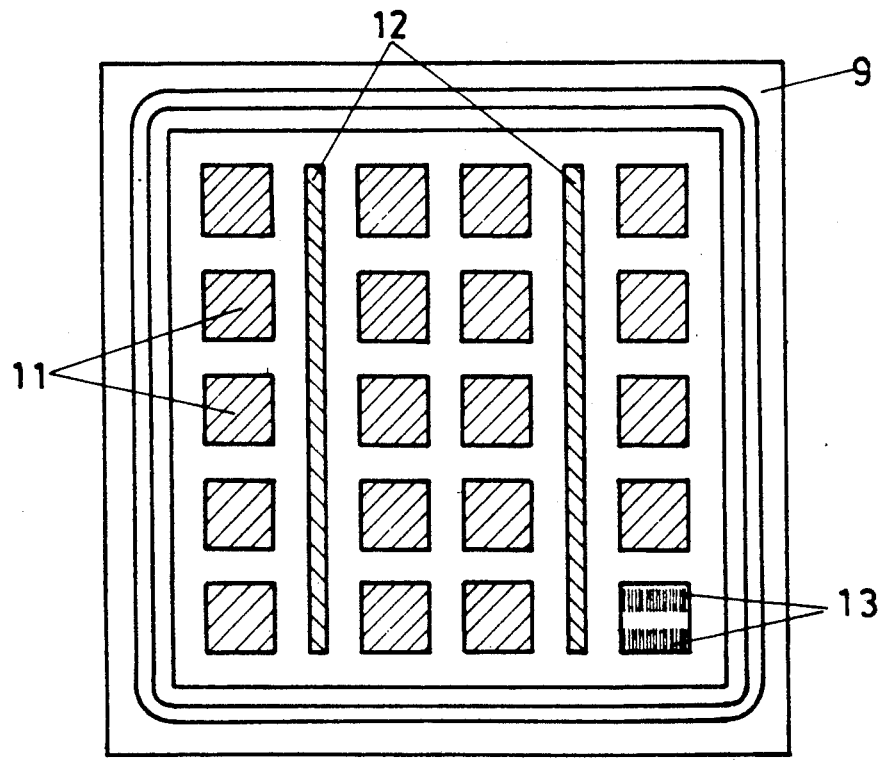
FIG.3

FAST POWER SEMICONDUCTOR CIRCUIT

BACKGROUND OF THE INVENTION

1. Field of the Invention

The present invention is concerned with the field of power electronics. In particular it relates to a fast power semiconductor circuit, comprising (a) a gate turn-off component with an anode and a cathode, which component is in the form of a large-area semiconductor substrate with an anode side and a cathode side opposite the anode side, the anode being arranged on the anode side, and the cathode being arranged together with the gate on the cathode side; and (b) a drive circuit, which is connected to the gate and the cathode, and generates a current pulse for turning off the component.

Such a circuit is known, for example, from EP-A2-0 228 226.

2. Discussion of Background

The novel, fast, gate turn-off power semiconductor components, which are being used increasingly in power electronics, such as for example the FCTh (Field Controlled Thyristor), the IGBT (Insulated Gate Bipolar Transistor) or the HF-GTO, require short current pulses with very high rates of current rise di/dt for driving.

To be able to achieve such high di/dt values, total values for the inductance L of the drive circuit of only a few nH or, under certain circumstances, of <1 nH are allowed. An arrangement of the drive circuit outside the component housing and a feeding of the control pulses through coaxial cables, for example, is consequently no longer possible.

A possible solution of the inductance problem would be to attach the corresponding drive circuits on the gate side directly on top of the semiconductor substrate ("piggy-back" arrangement). However, this solution would have the following disadvantages:

excessive space requirement;

pressure contacts cannot be realized for components having a diameter >1"; and cooling of drive circuits at high frequencies, for example in a module, presents problems.

SUMMARY OF THE INVENTION

Accordingly, one object of this invention is to provide a novel power semiconductor circuit with a turn-off component in which the driving is low-inductive, and the drive circuit can be attached at a favorable distance from the component.

The object is achieved in the case of a circuit of the abovementioned type in the following way:

(c) the drive circuit is connected to the semiconductor substrate by a large-area stripline;

(d) the stripline comprises an insulating layer, which lies in the center and is provided on one side with an upper metallization and on the other side with a lower metallization; and (e) the upper metallization is used essentially as feed to the cathode and the lower metallization is used essentially as feed to the gate.

The essence of the invention consists in connecting the semiconductor substrate of the component to the drive circuit by an extremely low-inductive stripline, which can at the same time be used for assembly of the individual elements (capacitors and MOSFETs) of the drive circuit.

According to a first preferred embodiment of the invention, the insulating layer of the stripline consists of a flexible polyimide plastic film and the upper metallization and lower metallization consist in each case of Cu.

A further embodiment of the invention is distinguished by the following (a) on the cathode side of the semiconductor substrate, cathode contacts and gate contacts, distributed over the surface, are provided for the connection of cathode and gate;

(b) on the lower side of the stripline, the lower metallization is divided into a gate metallization with gate regions and separate cathode regions, the cathode regions corresponding to the cathode contacts and the gate regions corresponding to the gate contacts;

(c) the stripline contacts with its lower side the semiconductor substrate on the cathode side over a large area, the cathode regions resting on the cathode contacts and the gate regions resting on the gate contacts; and (d) the cathode regions are conductively connected to the upper metallization of the stripline by means of plated-through holes.

BRIEF DESCRIPTION OF THE DRAWINGS

A more complete appreciation of the invention and many of the attendant advantages thereof will be readily obtained as the same becomes better understood by reference to the following detailed description when considered in connection with the accompanying drawings, wherein:

FIG. 1 shows the section through a stripline, as is used in the case of the invention;

FIG. 2 shows the circuit diagram of a preferred embodiment of the circuit according to the invention;

FIG. 3 shows the plan view of the cathode side of an FCTh, as is used in an exemplary embodiment of the invention;

DESCRIPTION OF THE PREFERRED EMBODIMENTS

Figure 4A:
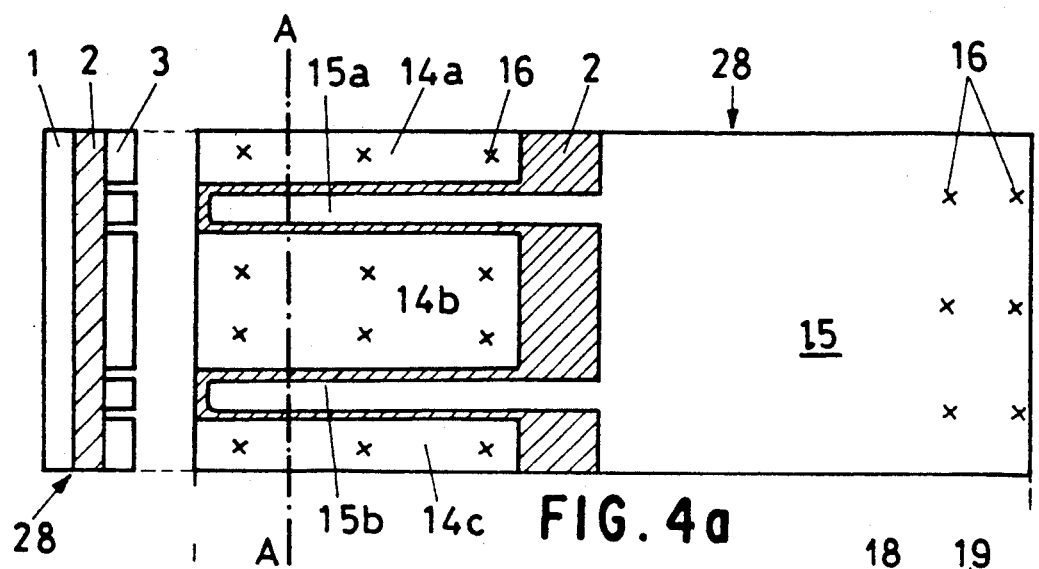
FIG. 4a shows the plan view of the lower side of a stripline for an FCTh according to FIG. 3, as well as a corresponding cross-section.

Referring now to the drawings, wherein like reference numerals designate identical or corresponding parts throughout the several views, in FIG. 1 a stripline 28 is represented diagrammatically in cross-section as the centerpiece of the proposed low-inductive arrangement of semiconductor component and drive circuit connected to the latter.

The stripline 28 is composed of an insulating layer 2, which lies in the center and is provided on the upper side with an upper metallization 1 and on the lower side with a corresponding lower metallization 3.

A flexible plastic film, which may consist in particular of a polyimide (due to the stress resistance and temperature resistance during soldering) is used with preference as insulating layer 2. Cu is preferably used for the metallizations 1 and 3. Such a copper-laminated film is known, for example, as base material for flexible printed-circuit boards.

The two metallizations 1 and 3 of the stripline 28 serve as feeds and drains for the control current (J and −J, respectively) in the drive circuit of the semiconductor component. With a width b of the stripline 28 and a thickness d of the insulating layer 2, such a stripline arrangement has (according to M. Hess, Elektronik, issue 18, 1988) an inductance per unit length L' (inductance per length of strip) of approximately $$L' = 1257(d/b)[nH/m]$$

L' may be reduced as much as desired by increasing the width b or reducing the thickness d of the insulating layer 2 (or of the plastic film). The minimum of the thickness d is in this case given by the dielectric strength required in the particular case.

With technically feasible dimensions of $d=1.10^{-4}$ m, and b=0.02 m, L'=6.3 nH/m is obtained. For comparison, a typical coaxial line having a surge impedance of 50 Ω has an inductance per unit length of L'=241 nH/m. From this, it can be recognized immediately that, with the required low inductances of a few nH in the drive circuit, only the stripline arrangement makes it possible in principle to arrange the drive circuit at the relatively great distance of up to 1 m away from the power semiconductor.

As an example of a power semiconductor circuit according to the invention, the circuitry used to drive an FCTh in a module housing will be described in more detail below. However, the drive principles presented here apply equally well to other fast, turn-off components, such as for example IGBTs and HF-GTOs.

The basic circuit for such a drive circuit arrangement AS is reproduced in FIG. 2. The drive circuit arrangement AS lies between the gate G1 and the cathode K1 of a component 10 and, in this exemplary embodiment, includes three parallel-connected drive circuits with, in each case, a MOSFET F1,...,F3 and a low-inductive ceramic capacitor C1,...,C3. The flow of current, which encloses the low-inductive drive, is marked in the Figure by a circular arrow.

The capacitors C1,...,C3 are charged via the input terminals 5 and 6 by means of a supply voltage $V_s$. The control of the MOSFETs F1,...,F3 is performed by a control voltage $V_G$ via the input terminals 4 and 5. The component 10 is connected by the anode A1 and the cathode K1 to the output terminals 7 and 8, which are connected to the load to be switched.

Optionally, a diode 27 (with the anode A2 and the cathode K2), which is discussed in further detail below, can be connected in antiparallel with the component 10.

Incidentally, the parallel connection of a plurality of drive circuits shown in FIG. 2 is only necessary if the drive circuit arrangement AS has to supply large current pulses which exceed the capacity of a single MOSFET. On the other hand, further drive circuits may be connected in parallel in order to achieve a more uniform current distribution.

The component 10 drawn-in in FIG. 2 may—as already mentioned—be of a different design and different operating principle, but is intended here to be designed as an FCTh. FIG. 3 shows in plan view the cathode-side metallization pattern of such an exemplary FCTh of higher power (220 A), as it has to be contacted over a large area by the drive circuit.

The uncontacted FCTh in the Figure consists of a rectangular semiconductor substrate 9, into which a series of differently doped layers, which are characteristic of an FCTh and are known (see in this respect for example EP-A2 0 178 387), have been introduced by a large number of production steps.

The cathode side of the FCTh has a stepped gate-cathode structure with a large number of elongate cathode fingers 13, which project out of a deeper-lying gate level.

In the example of FIG. 3, two rows of (for example 50) cathode fingers 13 are combined in each case to form a thyristor element and are provided with a common cathode contact 11 (in the case of one of the 20 thyristor elements in FIG. 3, the cathode contact 11 has been omitted to enable the position of the cathode fingers 13 to be shown). Elongate gate contacts 12, which are in connection with the deeper-lying gate level, are arranged between the rectangular thyristor elements with their cathode contacts 11.

Figure 4B:
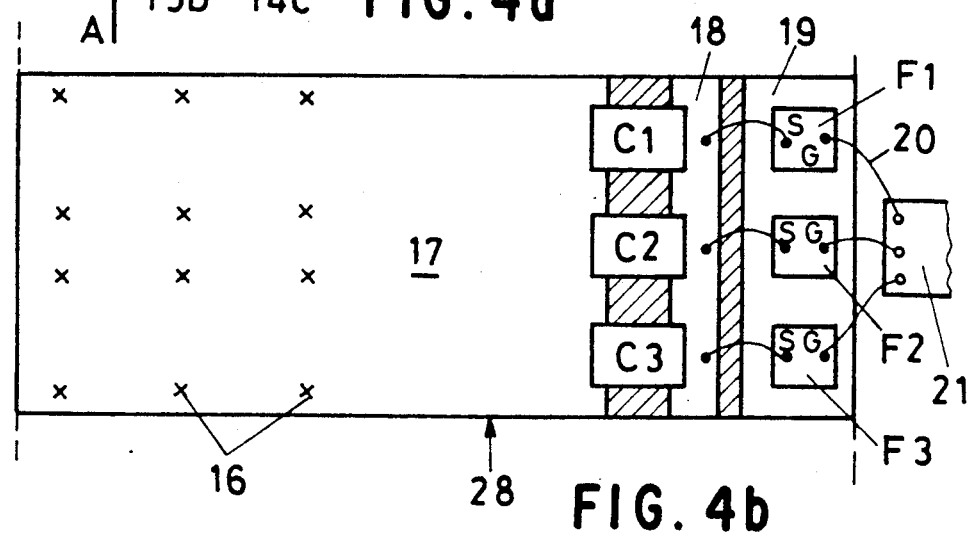
FIG. 4b shows the plan view of the upper side of a stripline according to FIG. 4a with the fitted capacitors and MOSFETs of the drive circuit.
Figure 4C:
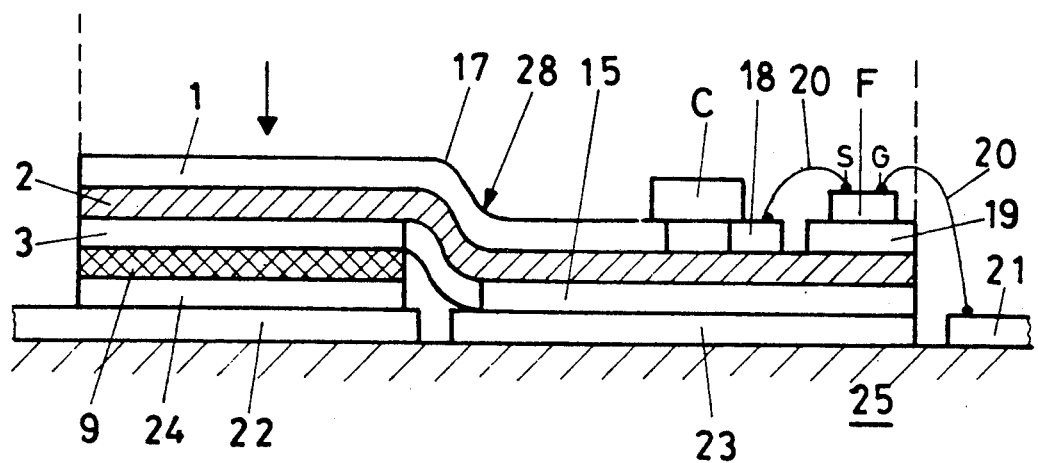
FIG. 4c shows the section through a finish-wired circuit with an FCTh according to FIG. 3 and a stripline according to FIGS. 4a,b.

The FCTh from FIG. 3 and its drive circuit arrangement AS according to FIG. 2 are then connected and form a module, as is represented in FIG. 4c.

The basis of the module is an insulating ceramic substrate 25 with substrate metallizations 21,...,23 structured in a suitable way. The first substrate metallization 21 corresponds in its function to the input terminal 4 in FIG. 2 and serves as base for the connections to the gates of the MOSFETs F1,...,F3.

The semiconductor substrate 9 of the FCTh is bonded on the anode side to the second substrate metallization 22 by a molybdenum plate 24 lying in between. From the upper cathode side of the semiconductor substrate 9 there leads a stripline 28 to the adjacent third substrate metallization 23.

According to FIG. 4a, the lower metallization 3, structured by etching, of the stripline 28 is divided into a large-area gate metallization 15 with adjoining gate regions 15a,b. The gate regions 15a,b are in turn surrounded by cathode regions 14a,b,c.

When the stripline 28 comes to rest with its lower metallization 3 on the semiconductor substrate 9, turned through 90° with respect to FIG. 3, the gate regions 15a,b contact the corresponding gate contacts 12, and the cathode regions 14a,b,c contact the corresponding cathode contacts 11.

The connection between the regions 14a,b,c and 15a,b and the contacts 11 and 12, respectively, is performed with preference via a solder connection (if appropriate with a molybdenum plate, not drawn-in in FIG. 4c, as intermediate layer) in the left-hand region of the stripline 28, but is also possible by pure pressure loading (indicated by the arrow).

According to FIG. 4b, the upper metallization 1, structured by etching, of the stripline 28 is divided into a large-area cathode metallization 17, a source metallization 18 and a drain metallization 19. The cathode metallization 17 is in conductive connection with the cathode regions 14a,b,c on the other side of the insulating layer 2 via plated-through holes 16. In the same way, the gate metallization 15 and the drain metallization 19 are connected to each other.

The described plated-through holes 16 between the upper metallization 1 and the lower metallization 3 of the stripline 28 have the effect that the former is used essentially as feed to the cathode K1 and the latter is essentially used as feed to the gate G1 of the FCTh.

Between the cathode metallization 17 and the source metallization 18, the capacitors C1,..,C3 are attached on the stripline 28 by conductive adhesive or soldering. Correspondingly, the MOSFETs F1,..,F3 are arranged on the drain metallization 19, with the drain side downward.

Source S and gate G of the MOSFETs F1,..,F3 are connected to the source metallization 18 and to the first substrate metallization 21 by bonding wires 20 in each case (FIGS. 4b,c). This type of contacting is extremely critical with respect to the inductance of the drive circuit. Therefore, the wiring should be led as flat as possible, parallel to the stripline 28.

Incidentally, instead of the MOSFETs F1,..,F3, bipolar power transistors or other fast components which allow the use of more favorable planar contacting methods with metal strips, and thus introduce less additional inductance to the drive circuits, may be used.

Use of the stripline 28 also makes its possible without any problems to contact additionally within a module according to FIG. 4c an ultrafast free-wheeling diode, which is required for most bridge circuits in converters. As already mentioned in conjunction with FIG. 2, such a diode 27 is connected antiparallel with the FCTh.

Figure 5:
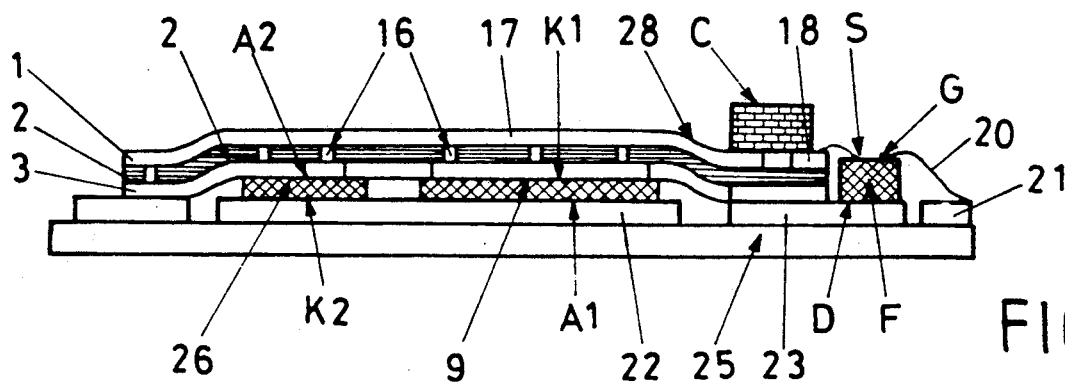
FIG. 5 shows the section through an arrangement analogous to FIG. 4c with additional, antiparallel diode.

Integration of the diode 27 in the form of a diode chip 26 results in a modular construction, as represented in FIG. 5. The diode chip 26 is arranged directly alongside the semiconductor substrate 9 of the FCTh on the second substrate metallization 22. Its cathode K2 and its anode A2 are interchanged in comparison with the anode A1 and the cathode K1 of the FCTh. The anode A2 is contacted over a large area from the lower side of the stripline 28.

In this embodiment, the MOSFETs F are not placed on the upper side of the stripline 28 but directly on the third substrate metallization 23 of the substrate 25. This has the effect of additionally shortening the critical line routes.

In the case of components having diameters of 1.5 inches and more, solder contacts are not very suitable for electrical contacting and the removal of lost heat from the component. Then a so-called pressure contact is used, with which the contacting is ensured by the pressing into place of contact washers with an adequate contact pressure.

The wiring principle with the stripline is also suitable in principle for ensuring an extremely low-inductive drive for the pressure contact of a large FCTh or other large-area fast components.

Figure 6:
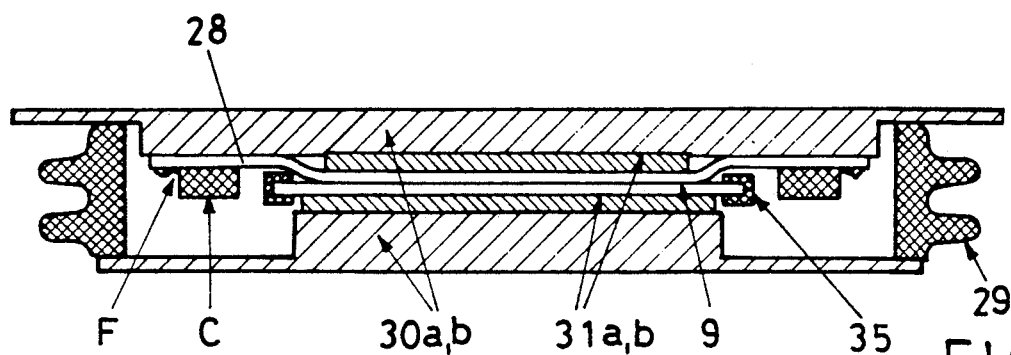
FIG. 6 shows the section through an arrangement with rotationally symmetrical semiconductor substrate and stripline in a cylindrical insulating housing.
Figure 7:
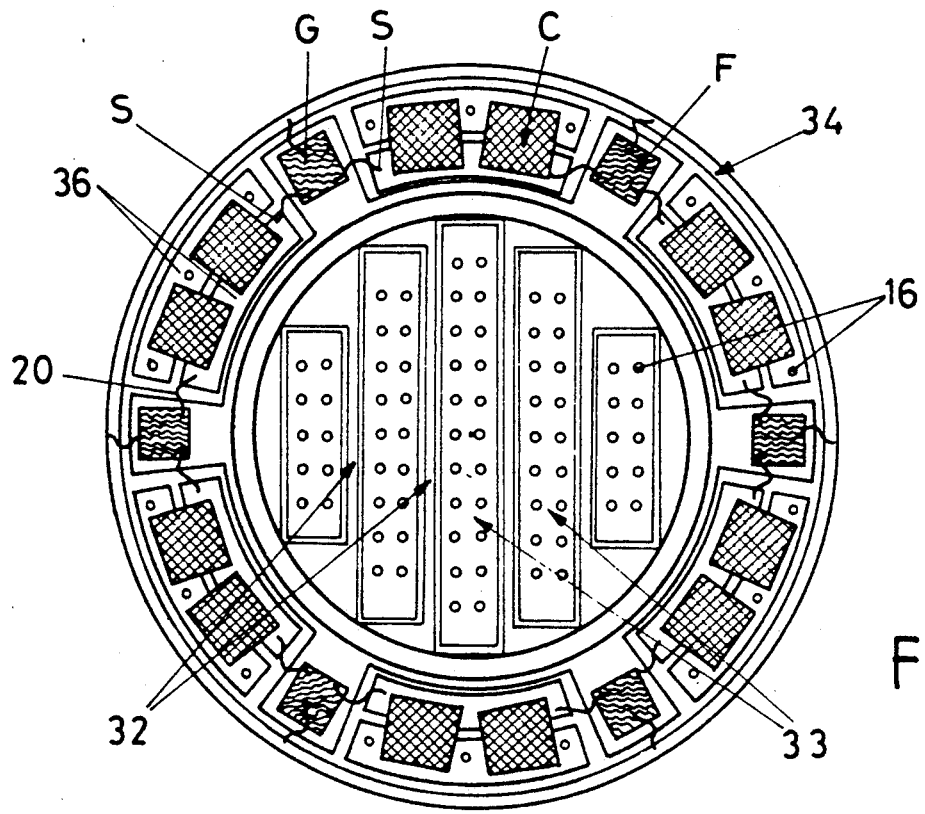
FIG. 7 shows the plan view of a stripline, as used in an arrangement according to FIG. 6.

A preferred exemplary embodiment for such a low-inductive pressure contact arrangement is reproduced in FIGS. 6 and 7. The (in this case round) semiconductor substrate 9 (with a suitable edge passivation 35) is clamped between two molybdenum plates 31a,b and two copper plates 30a,b, lying further to the outside, in a cylindrical insulating housing 29.

The stripline 28 is arranged between the upper of the two molybdenum plates 31a,b and the semiconductor substrate 28 and presses with its lower side, which is structured by etching and represented in FIG. 7 in plan view, onto the cathode and gate contacts of the component. The capacitors C and MOSFETs F are fitted on the same lower side of the stripline 28 at the periphery, i.e. on the edge projecting beyond the semiconductor substrate 9, distributed symmetrically around the FCTh.

In the example represented, six drive circuits are connected in parallel with, in each case, two capacitors C and a MOSFET F (FIG. 7). The lower metallization of the stripline 28 is for this purpose (as FIG. 7 shows) divided into cathode regions 33, gate regions 32, ring regions 36 and a ring line 34. The capacitors C are arranged between the ring regions 36, of which the outer ones in each case are connected to the other side of the stripline 28 by means of plated-through holes 16.

The square cathode regions 33 are likewise plated directly through to the upper side of the stripline 28, and consequently to the upper of the two copper plates 30a,b, by means of plated-through holes 16.

The ring line 34, running along the outer edge of the stripline 28, is connected to the gates G of the MOSFETs F, while its sources S are in each case connected to the inner ones of the ring regions 36 and the gates G are in direct connection with the gate regions 32.

The flow of current for the drive pulse consequently passes from the gate G1 of the FCTh via drain D and source S of the MOSFETs F, then via the capacitors C and the plated-through holes 16 in the ring regions 36 to the upper side of the stripline 28 and from there via the plated-through holes 16 within the cathode regions 33 back to the cathode K1 of the FCTh.

The cathode-side metallization of the FCTh must look like the inner region of the stripline 28 represented in FIG. 7, i.e. the cathode is divided into rectangular segments and the gate is divided into corresponding strips.

In all, fast power semiconductor circuits with turn-off components which, due to the low-inductive connection between component and drive, allow high switching frequencies to be accomplished can thus be realized with the invention.

Obviously, numerous modifications and variations of the present invention are possible in light of the above teachings. It is therefore to be understood that, within the scope of the appended claims, the invention may be practiced otherwise than as specifically described herein.

What is claimed as new and desired to be secured by letters patent of the United States is:

1. A fast power semiconductor circuit, comprising:
   a gate turn-off component comprising a large-area semiconductor substrate with an anode side and a cathode side opposite the anode side, an anode arranged on the anode side, and a cathode and a gate arranged on the cathode side;
   a drive circuit, which is connected between the gate and the cathode, and generates a current pulse for turning off the component;
   the drive circuit connected to the semiconductor substrate by a large-area stripline;
   the stripline comprising an insulating layer having opposed first and second sides upon which respective first and second metallizations are formed; and
   said drive circuit connected to said semiconductor device by selected portions of said first and second metallizations, which are respectively connected to said gate and said cathode.

2. A circuit as claimed in claim 1, wherein the insulating layer of the stripline comprises a flexible plastic film.

3. A circuit as claimed in claim 2, wherein:
(a) the plastic film is produced from a polyimide; and
(b) the first and second metallizations comprise Cu.

4. A circuit as claimed in claim 1, wherein:
(a) the drive circuit comprises a plurality of capacitors and MOSFETs, each capacitors being connected in series with a respective MOSFET and the series connected capacitors and MOSFETs being connected in parallel with each other; and
(b) at least the capacitors are arranged and fastened on the stripline itself.

5. A circuit as claimed in claim 4, wherein the MOSFETs are also arranged and fastened on the stripline.

6. A circuit as claimed in claim 1, wherein:
(a) on the cathode side of the semiconductor substrate, cathode contacts and gate contacts, distributed over the surface, are provided for the connection of cathode and gate to said respective selected portions of said first and second metallizations;
(b) on the first side of the stripline, the first metallization is divided into a gate metallization portion with gate regions and a separate cathode metallization portion with cathode regions, the cathode regions corresponding to the cathode contacts and the gate regions corresponding to the gate contacts;
(c) the stripline contacts with its first side the semiconductor substrate on the cathode side over a large area, the cathode regions resting on the cathode contacts and the gate regions resting on the gate contacts; and
(d) the cathode regions being conductively connected to the second metallization of the stripline by means of plated-through holes.

7. A circuit as claimed in claim 6, wherein:
(a) the anode side of the semiconductor substrate is fastened on a ceramic substrate;
(b) the stripline is likewise fastened on the ceramic substrate outside the semiconductor substrate by said gate metallization portion;
(c) the drive circuit comprises a plurality of capacitors and MOSFETs, each capacitor being connected in series with a respective MOSFET, with the series connected capacitors and MOSFETs being connected in parallel with one another;
(d) on the second side of the stripline, the second metallization is divided into a cathode metallization portion opposite the cathode regions and a separate source metallization portion opposite the gate metallization portion; and
(e) the capacitors are arranged on the second side of the stripline between the cathode metallization portion and the source metallization portion.

8. A circuit as claimed in claim 7, wherein:
(a) the second metallization of the stripline comprises in addition to the cathode metallization portion and the source metallization portion also a further separate drain metallization portion; and
(b) the MOSFETs on the second side of the stripline are arranged in the region of the drain metallization portion.

9. A circuit as claimed in claim 7, wherein
(a) a diode in the form of a diode chip is connected in antiparallel with the gate turn-off component;
(b) the diode chip has a cathode side fastened on the ceramic substrate; and
(c) the stripline contacts with its first side, an anode side of the diode chip over a large area.

10. A circuit as claimed in claim 6, wherein:
(a) the semiconductor substrate and the stripline have a circular shape, the diameter of the stripline being greater than the diameter of the semiconductor substrate;
(b) the stripline and the semiconductor substrate are clamped concentrically one on top of the other in a cylindrical insulating housing between two innerlying molybdenum plates and two outerlying copper plates;
(c) the drive circuit comprises a plurality of capacitors and MOSFETs, each capacitor connected in series with a respective MOSFET, with series connected capacitors and MOSFETs being connected in parallel with one another; and
(d) the capacitors and MOSFETs are arranged on an edge of the stripline, projecting beyond the semiconductor substrate, around the semiconductor substrate.

* * * * *